(12) United States Patent
Bean et al.

(10) Patent No.: US 7,049,573 B2
(45) Date of Patent: May 23, 2006

(54) NONCHANNELED COLOR CAPABLE PHOTOELECTRONIC EFFECT IMAGE SENSOR AND METHOD

(75) Inventors: Heather N. Bean, Fort Collins, CO (US); Mark N. Robins, Greeley, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 129 days.

(21) Appl. No.: 10/919,985

(22) Filed: Aug. 17, 2004

(65) Prior Publication Data

US 2006/0038111 A1    Feb. 23, 2006

(51) Int. Cl.
*H01J 5/16*    (2006.01)
(52) U.S. Cl. .................................. 250/208.1; 250/226
(58) Field of Classification Search ............ 250/208.1, 250/226; 257/440; 358/512, 515, 518, 557; 382/312, 321, 162, 163, 164, 165
See application file for complete search history.

(56) References Cited

U.S. PATENT DOCUMENTS

| | | | | |
|---|---|---|---|---|
| 3,056,062 A | * | 9/1962 | Max et al. ..................... | 315/11 |
| 3,467,880 A | * | 9/1969 | Crowell ....................... | 315/11 |
| 6,774,385 B1 | * | 8/2004 | Imai ........................... | 250/580 |
| 6,975,575 B1 | * | 12/2005 | Gibson et al. ............... | 369/100 |

\* cited by examiner

*Primary Examiner*—Georgia Epps
*Assistant Examiner*—Don Williams

(57) ABSTRACT

A photoelectric imaging sensor comprising a bias frame and electron collector and an electron emissive photosensitive material disposed on a first side of the bias frame and electron collector. A piezoelectric variable color filter is disposed on a second side of the bias frame and electron collector, piezoelectric separation control circuitry is coupled to the piezoelectric variable color filter that controls separation of colors thereby, and a current switch connected to the electron collector.

9 Claims, 2 Drawing Sheets

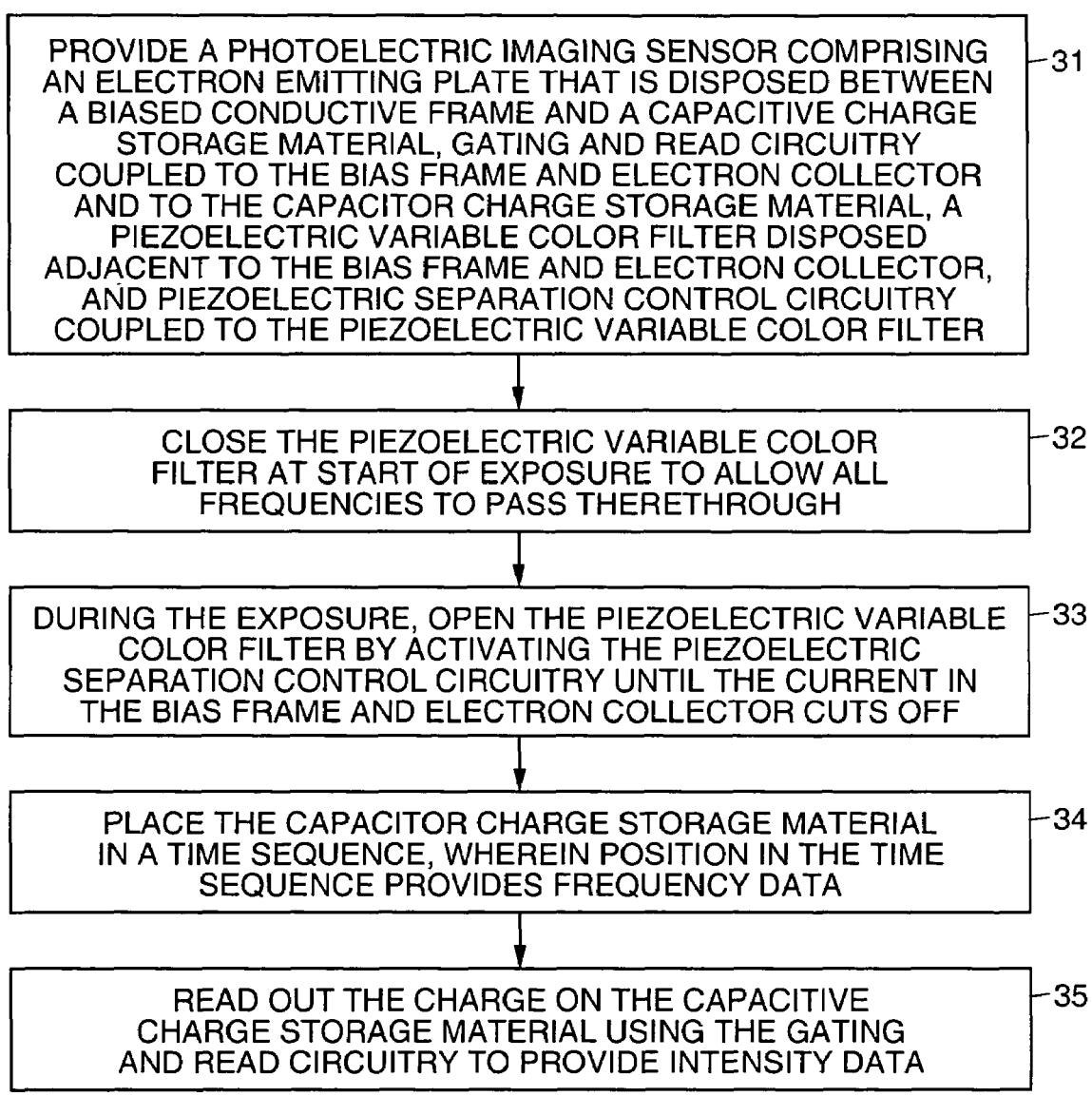

NONCHANNELED COLOR CAPABLE PHOTOELECTRONIC EFFECT IMAGE SENSOR AND METHOD

TECHNICAL FIELD

The present invention relates generally to photoelectric imaging sensors and methods, and more specifically, to an improved photoelectric imaging sensor and method that provide for nonchanneled color capabilities.

BACKGROUND

The assignee of the present invention has heretofore developed photoelectric effect image sensors. Exemplary photoelectric effect image sensors are described in U.S. patent application Ser. No. 10/919,715, entitled "Photoelectric Imaging Sensor and Method", for example, which are assigned to the assignee of the present invention.

An exemplary photoelectric effect image sensor, as is generally disclosed in the above-referenced patent application, comprises a bias frame and electron collector disposed adjacent to an electron emissive photosensitive material which is disposed adjacent to a capacitive charge storage material. Gating circuitry is coupled to the bias frame and electron collector and to the capacitor charge storage material. However, such a photoelectric effect image sensor, without enhancement, cannot provide high resolution color imaging. Furthermore such a photoelectric effect image sensor cannot split color into three channels.

SUMMARY

An embodiment of the present invention provides for a photoelectric imaging sensor that improves upon the design discussed in the Background section. A method is also disclosed.

A further embodiment adds a piezoelectrically controlled variable color filter and a current switch connected to the electron collector of the exemplary sensor. The piezoelectrically controlled variable color filter may be dedicated to a single pixel, or may be applied to the entire sensor array. Piezoelectrically controlled separation control circuitry is coupled to the piezoelectric variable color filter to permit broad separation of colors.

BRIEF DESCRIPTION OF THE DRAWINGS

The various features and advantages of embodiments of the present invention may be more readily understood with reference to the following detailed description taken in conjunction with the accompanying drawings, wherein like reference numerals designate like structural elements, and in which:

FIG. 3 is a flow diagram illustrating an exemplary method in accordance with the principles of the present invention.

DETAILED DESCRIPTION

Figure 1:
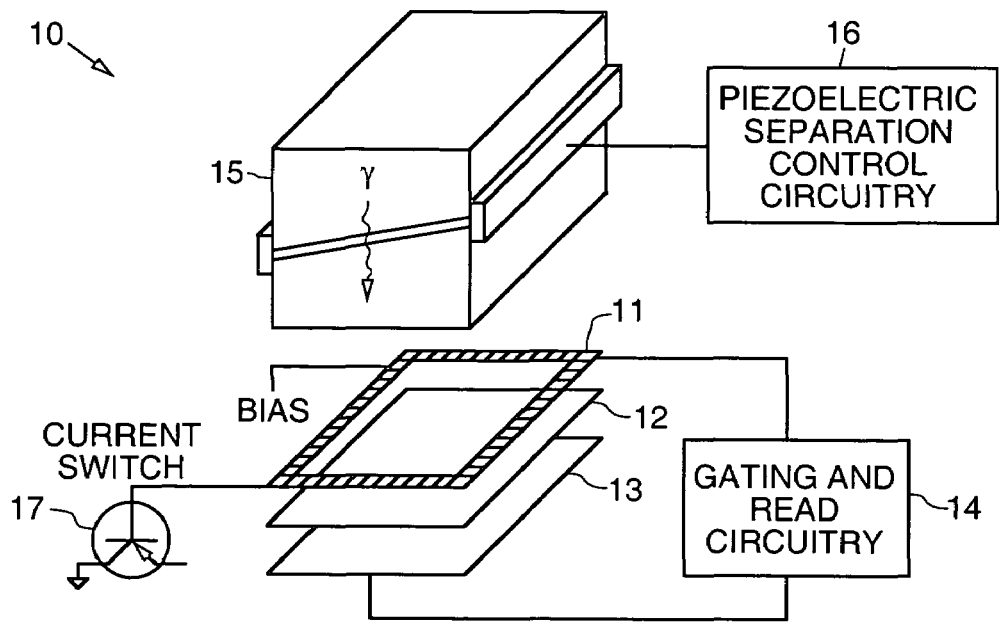
FIG. 1 illustrates an exemplary embodiment of a photoelectric imaging sensor in accordance with the principles of the present invention.
Figure 2:
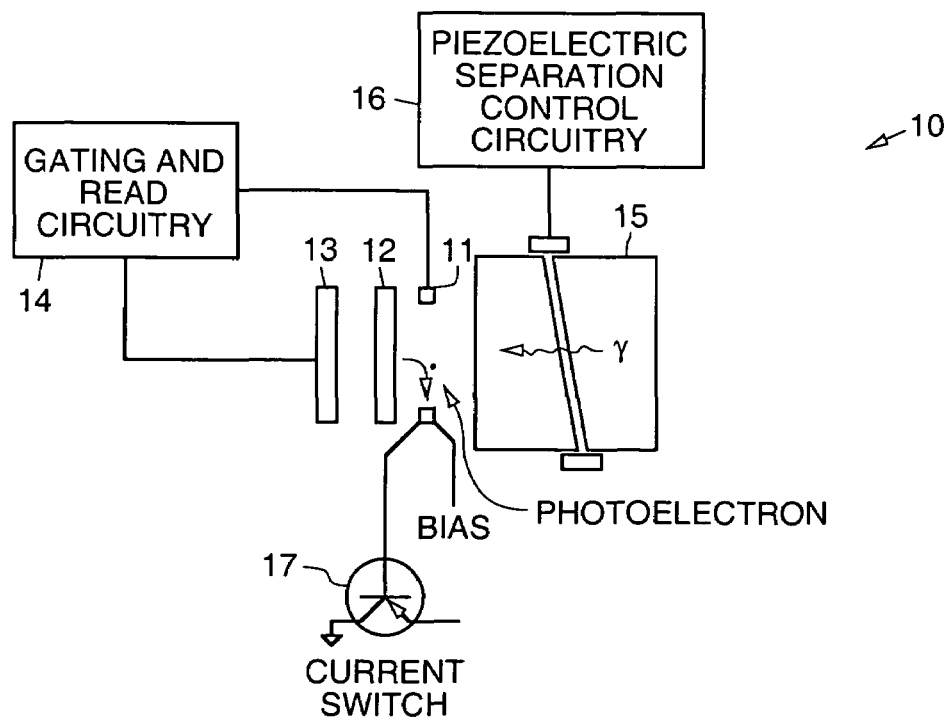
FIG. 2 is a schematic diagram of the exemplary photoelectric imaging sensor shown in FIG. 1.

Referring to the drawing figures, FIG. 1 illustrates an exemplary embodiment of a photoelectric imaging sensor 10 in accordance with the principles of the present invention. FIG. 2 is a schematic diagram of the exemplary photoelectric imaging sensor 10.

As is shown in the drawing figures, the exemplary photoelectric imaging sensor 10 comprises a bias frame and electron collector 11 which are disposed adjacent to an electron emissive photosensitive material 12 which is in turn disposed adjacent to a capacitive charge storage material 13. The bias frame and electron collector 11 may be constructed using conventional metalization processes. Gating and read circuitry 14 is coupled to the bias frame and electron collector 11 and to the capacitor charge storage material 12.

In accordance with the present invention, a piezoelectric variable color filter 15 is disposed adjacent to the bias frame and electron collector 11 through which light passes from an image scene. The piezoelectric variable color filter 15 comprises a transparent material. Only a single piezoelectrally controled filter 15 is needed for an entire array of photoelectric pixels comprising the capacitive charge storage material 13.

Piezoelectric separation control circuitry 16 is coupled to the piezoelectric variable color filter 15 to permit separation of colors thereby. The piezoelectric separation control circuitry 16 functions to open and close the piezoelectric variable color filter 15. A current switch 17 connected to the bias frame and electron collector 11. The current switch 17 functions to signal completion of photoelectron generation. This signal, correlated to the position of the piezoelectrically controlled variable color filter provides frequency information.

There are no separate color channels used in the present photoelectric imaging sensor 10, while both frequency and amplitude data are collected. Color and intensity data from all pixels are used, with no loss of resolution de to the necessity of color filter patterns.

In operation, at the start of exposure, the piezoelectric variable color filter 15 is closed allowing all frequencies to pass through it. During the exposure, the piezoelectric variable color filter 15 is opened by activating the piezoelectric separation control circuitry 16 until the current in the bias frame and electron collector 11 cuts off. This indicates that photoelectron generation has ceased. At this point, the pixel reports, that is, places itself in a time sequence. The reporting sequence along with the associated filter gap provides frequency information. More particularly, the position in the time sequence provides frequency data. A subsequent read of the charge on the capacitive charge storage material 12 by the gating and read circuitry 14 provides intensity data.

FIG. 3 is a flow diagram illustrating an exemplary method 30 in accordance with the principles of the present invention. The exemplary method 30 comprises the following steps.

A photoelectric imaging sensor 10 is provided 31 that comprises an electron emitting plate 12 that is disposed between a biased conductive frame 11 and a capacitive charge storage material 13, gating and read circuitry 14 coupled to the bias frame and electron collector 11 and to the capacitor charge storage material 12, a single pixel piezoelectric variable color filter 15 disposed adjacent to the bias frame and electron collector 11, and piezoelectric separation control circuitry 16 coupled to the piezoelectric variable color filter 15.

The piezoelectric variable color filter is closed 32 at start of exposure to allow all frequencies to pass therethrough. During the exposure, the piezoelectric variable color filter 15 is opened 33 by activating the piezoelectric separation control circuitry 16 until the current in the bias frame and electron collector 11 cuts off. The capacitor charge storage material 12 then places 34 itself in a time sequence, wherein position in the time sequence provides frequency data. The charge on the capacitive charge storage material 12 is read 35 by the gating and read circuitry 14 to provide intensity data.

Thus, an improved photoelectric imaging sensor that provide for electronic shuttering and frequency filtering has been disclosed. It is to be understood that the above-described embodiment is merely illustrative of some of the many specific embodiments that represent applications of the principles of the present invention. Clearly, numerous and other arrangements can be readily devised by those skilled in the art without departing from the scope of the invention.

What is claimed is:

1. A photoelectric imaging sensor comprising:
   a bias frame and electron collector;
   an electron emissive photosensitive material disposed on a first side of the bias frame and electron collector;
   a capacitive charge storage material disposed adjacent to the electron emissive photosensitive material and distal from the bias frame and electron collector;
   gating and read circuitry coupled to the bias frame and electron collector and to the capacitor charge storage material;
   a piezoelectric variable color filter disposed on a second side of the bias frame and electron collector;
   piezoelectric separation control circuitry coupled to the piezoelectric variable color filter that controls separation of colors thereby; and
   a current switch connected to the bias frame electron collector.

2. The photoelectric imaging sensor recited in claim 1 wherein the piezoelectric separation control circuitry comprises circuitry governing filter separation and performance characteristics.

3. The photoelectric imaging sensor recited in claim 1 wherein the piezoelectric separation control circuitry opens and closes the piezoelectric variable color filter.

4. The photoelectric imaging sensor recited in claim 1 wherein the current switch is operative to indicate termination of photoelectron generation.

5. A method comprising:
   providing a photoelectric imaging sensor comprising an electron emitting plate that is disposed between a biased conductive frame and a capacitive charge storage material, gating and read circuitry coupled to the bias frame and electron collector and to the capacitor charge storage material, a piezoelectric variable color filter disposed adjacent to the bias frame and electron collector, and piezoelectric separation control circuitry coupled to the piezoelectric variable color filter;
   closing the piezoelectric variable color filter at start of exposure to allow all frequencies to pass therethrough;
   during the exposure, opening the piezoelectric variable color filter by activating the piezoelectric separation control circuitry until the current in the bias frame and electron collector cuts off;
   placing the capacitor charge storage material in a time sequence, wherein position in the time sequence provides frequency data; and
   reading out the charge on the capacitive charge storage material using the gating and read circuitry to provide intensity data.

6. Apparatus comprising:
   bias and electron collection means;
   an electron emissive photosensitive material disposed on a first side of the bias and electron collection means;
   a capacitive charge storage material disposed adjacent to the electron emissive photosensitive material and distal from the bias and electron collection means;
   gating and read means coupled to the bias and electron collection means and to the capacitor charge storage material;
   piezoelectric variable color filter means disposed on a second side of the bias and electron collection means;
   piezoelectric separation control means coupled to the piezoelectric variable color filter means for controlling separation of colors thereby; and
   current switching means connected to the bias and electron collection means.

7. The apparatus recited in claim 6 wherein the piezoelectric separation control means comprises means for controlling filter separation and performance characteristics.

8. The apparatus recited in claim 6 wherein the piezoelectric separation control means opens and closes the piezoelectric variable color filter means.

9. The apparatus recited in claim 6 wherein the current switching means is operative to indicate termination of photoelectron generation.

* * * * *

UNITED STATES PATENT AND TRADEMARK OFFICE
CERTIFICATE OF CORRECTION

PATENT NO. : 7,049,573 B2  
APPLICATION NO. : 10/919985  
DATED : May 23, 2006  
INVENTOR(S) : Heather N. Bean et al.

It is certified that error appears in the above-identified patent and that said Letters Patent is hereby corrected as shown below:

Title Pg, Item (54), "Title", delete "PHOTOELECTRONIC" and insert
-- PHOTOELECTRIC --, therefor.

In column 1, line 2, delete "PHOTOELECTRONIC" and insert
-- PHOTOELECTRIC --, therefor.

Signed and Sealed this

Twenty-fourth Day of March, 2009

JOHN DOLL  
*Acting Director of the United States Patent and Trademark Office*